United States Patent
Kamata (10) Patent No.: US 7,358,795 B2
(45) Date of Patent: Apr. 15, 2008

(54) MOSFET TEMPERATURE COMPENSATION CURRENT SOURCE

(75) Inventor: Takatsugu Kamata, Yokohama (JP)

(73) Assignee: RfStream Corporation, Osaka (JP)

( * ) Notice: Subject to any disclaimer, the term of this patent is extended or adjusted under 35 U.S.C. 154(b) by 35 days.

(21) Appl. No.: 11/372,602

(22) Filed: Mar. 10, 2006

(65) Prior Publication Data

US 2006/0214723 A1 Sep. 28, 2006

Related U.S. Application Data

(60) Provisional application No. 60/660,728, filed on Mar. 11, 2005.

(51) Int. Cl.
*G05F 3/02* (2006.01)
(52) U.S. Cl. .................. 327/538; 327/541
(58) Field of Classification Search ............... 327/538, 327/541
See application file for complete search history.

(56) References Cited

U.S. PATENT DOCUMENTS

| | | |
|---|---|---|
| 1,735,742 A | 11/1929 | Fetter |
| 2,140,770 A | 12/1938 | Schofield |
| 2,325,174 A | 7/1943 | Cooper |
| 2,464,557 A | 3/1949 | Crokett |
| 2,496,177 A | 1/1950 | Richards et al. |
| 2,531,312 A | 11/1950 | Loon |
| 2,549,789 A | 4/1951 | Ferrill |
| 2,796,524 A | 6/1957 | Ferrill |
| 2,801,341 A | 7/1957 | Jaffe |
| 2,815,406 A | 12/1957 | Tongue |
| 3,252,096 A | 5/1966 | Carlson |
| 3,400,345 A | 9/1968 | Oloff |
| 3,488,595 A | 1/1970 | Vasile |
| 3,509,500 A | 4/1970 | McNair et al. |
| 3,544,903 A | 12/1970 | Sakamoto |
| 3,686,575 A | 8/1972 | Chamberlain |
| 3,794,941 A | 2/1974 | Templin |

(Continued)

FOREIGN PATENT DOCUMENTS

EP 0392449 B1 10/1990

(Continued)

OTHER PUBLICATIONS

U.S. Appl. No. 11/700,687, filed Jan. 30, 2007, Utsunomiya.

(Continued)

*Primary Examiner*—Kenneth B. Wells
(74) *Attorney, Agent, or Firm*—Stattler-Suh PC (57) ABSTRACT

A current source generates a constant current using metal oxide semiconductor (MOS) transistors. A biasing circuit generates a biasing current based on the transconductance of the MOS transistors. A load circuit, comprising a resistor coupled in parallel with a MOS transistor, generates a constant load current from the biasing current. The load current comprises the sum of a resistor current, which flows through the resistor, and a MOS current that flows through the transistor. The load current is constant because variations of the resistor current offset variations of the MOS current across temperature or process variations. A current mirror circuit generates an output current for the current source equal to a sum of the resistor current and the MOS current, the output current being approximately constant in value across temperature or process variations.

17 Claims, 7 Drawing Sheets

U.S. PATENT DOCUMENTS

| | | |
|---|---|---|
| 3,931,578 A | 1/1976 | Gittinger |
| 4,112,378 A | 9/1978 | Ito et al. |
| 4,118,679 A | 10/1978 | Hiday et al. |
| 4,138,654 A | 2/1979 | Luhowy |
| 4,296,391 A | 10/1981 | Hazama et al. |
| 4,330,794 A | 5/1982 | Sherwood |
| 4,379,271 A | 4/1983 | Lehmann |
| 4,456,895 A | 6/1984 | Landt et al. |
| 4,514,763 A | 4/1985 | Rindal |
| 4,555,809 A | 11/1985 | Carlson |
| 4,598,423 A | 7/1986 | Hettiger |
| 4,785,253 A | 11/1988 | Hughes |
| 4,789,897 A | 12/1988 | Kappeler et al. |
| 4,812,851 A | 3/1989 | Giubardo |
| 4,818,903 A | 4/1989 | Kawano |
| 4,882,614 A | 11/1989 | Kageyama et al. |
| 4,970,479 A | 11/1990 | Landt et al. |
| 4,985,769 A | 1/1991 | Yasumoto et al. |
| 4,988,902 A | 1/1991 | Dingwall |
| 5,077,542 A | 12/1991 | Lanoiselee |
| 5,122,868 A | 6/1992 | Isnardi |
| 5,146,337 A | 9/1992 | Grubbs |
| 5,146,338 A | 9/1992 | Lehmann et al. |
| 5,148,280 A | 9/1992 | Wignot et al. |
| 5,155,580 A | 10/1992 | Gibson et al. |
| 5,187,445 A | 2/1993 | Jackson |
| 5,263,018 A | 11/1993 | Christopher |
| 5,264,937 A | 11/1993 | Christopher |
| 5,287,180 A | 2/1994 | White |
| 5,386,239 A | 1/1995 | Wang et al. |
| 5,491,715 A | 2/1996 | Flaxl |
| 5,519,265 A | 5/1996 | Latham |
| 5,525,940 A | 6/1996 | Heikkila et al. |
| 5,663,773 A | 9/1997 | Goeckler |
| 5,737,035 A | 4/1998 | Rotzoll |
| 5,898,900 A | 4/1999 | Richter et al. |
| 5,905,398 A | 5/1999 | Todsen et al. |
| 5,914,633 A | 6/1999 | Comino et al. |
| 5,917,387 A | 6/1999 | Rice |
| 5,956,098 A | 9/1999 | Mizukami |
| 6,016,170 A | 1/2000 | Takayama et al. |
| 6,094,236 A | 7/2000 | Abe et al. |
| 6,104,442 A | 8/2000 | Patel et al. |
| 6,137,773 A | 10/2000 | Stilwell et al. |
| 6,169,569 B1 | 1/2001 | Widmer et al. |
| 6,177,964 B1 | 1/2001 | Birleson |
| 6,219,376 B1 | 4/2001 | Zhodzishsky et al. |
| 6,226,509 B1 | 5/2001 | Mole et al. |
| 6,243,567 B1 | 6/2001 | Saito |
| 6,256,495 B1 | 7/2001 | Francisco et al. |
| 6,275,113 B1 | 8/2001 | Nakano et al. |
| 6,307,443 B1 | 10/2001 | Gabara |
| 6,307,897 B1 | 10/2001 | Ohta et al. |
| 6,324,233 B1 | 11/2001 | Sempel et al. |
| 6,351,293 B1 | 2/2002 | Perlow |
| 6,359,940 B1 | 3/2002 | Ciccarelli et al. |
| 6,377,315 B1 | 4/2002 | Carr et al. |
| 6,407,622 B1 * | 6/2002 | Opris ............... 327/539 |
| 6,424,206 B2 | 7/2002 | Takahashi et al. |
| 6,424,209 B1 | 7/2002 | Gorecki et al. |
| 6,470,055 B1 | 10/2002 | Feher |
| 6,535,075 B2 | 3/2003 | Frech et al. |
| 6,535,722 B1 | 3/2003 | Rosen et al. |
| 6,538,521 B2 | 3/2003 | Kobayashi et al. |
| 6,593,828 B1 | 7/2003 | Helfenstein et al. |
| 6,597,748 B1 | 7/2003 | Hietala et al. |
| 6,628,728 B1 | 9/2003 | McCarty, Jr. |
| 6,631,256 B2 | 10/2003 | Suominen |
| 6,636,085 B2 | 10/2003 | Okazaki et al. |
| 6,657,678 B1 | 12/2003 | Mizukami et al. |
| 6,667,649 B1 | 12/2003 | Lee |
| 6,667,760 B1 | 12/2003 | Limberg |
| 6,680,971 B1 | 1/2004 | Tazebay |
| 6,686,817 B2 | 2/2004 | Zhu |
| 6,714,608 B1 | 3/2004 | Samueli et al. |
| 6,724,441 B2 | 4/2004 | Choi |
| 6,725,463 B1 | 4/2004 | Birleson |
| 6,744,335 B2 | 6/2004 | Ryhanen et al. |
| 6,750,734 B2 | 6/2004 | Utsunomiya et al. |
| 6,778,022 B1 | 8/2004 | Zhang et al. |
| 6,778,594 B1 | 8/2004 | Liu |
| 6,850,747 B1 | 2/2005 | Imbornone et al. |
| 6,856,652 B2 | 2/2005 | West et al. |
| 6,873,369 B2 | 3/2005 | Koyama |
| 6,882,245 B2 | 4/2005 | Utsunomiya et al. |
| 6,911,861 B2 * | 6/2005 | Deng ............... 327/513 |
| 6,937,670 B2 | 8/2005 | Cowley et al. |
| 6,940,358 B1 | 9/2005 | Meacham |
| 6,940,365 B2 | 9/2005 | Kamata et al. |
| 6,954,115 B2 | 10/2005 | Wong |
| 7,079,195 B1 | 7/2006 | Birleson et al. |
| 7,224,210 B2 * | 5/2007 | Garlapati et al. ........... 327/539 |
| 2002/0047942 A1 | 4/2002 | Vorenkamp |
| 2002/0050861 A1 | 5/2002 | Nguyen et al. |
| 2002/0186099 A1 | 12/2002 | Sengupta |
| 2003/0053562 A1 | 3/2003 | Busson et al. |
| 2003/0097601 A1 | 5/2003 | Glas et al. |
| 2003/0132455 A1 | 7/2003 | Utsunomiya et al. |
| 2003/0186671 A1 | 10/2003 | Prodanov et al. |
| 2003/0197810 A1 | 10/2003 | Jaffe |
| 2003/0223017 A1 | 12/2003 | Utsunomiya et al. |
| 2004/0095513 A1 | 5/2004 | Kamata et al. |
| 2004/0198289 A1 | 10/2004 | Ashkenazi |
| 2004/0233029 A1 | 11/2004 | Pohl et al. |
| 2005/0143039 A1 | 6/2005 | Kamata et al. |
| 2006/0028301 A1 | 2/2006 | Kamata et al. |
| 2006/0229046 A1 | 10/2006 | Bult |

FOREIGN PATENT DOCUMENTS

| | | |
|---|---|---|
| EP | 0676880 | 10/1995 |
| EP | 0707379 A1 | 4/1996 |
| JP | 11122067 A2 | 4/1999 |
| JP | 11122068 A2 | 4/1999 |
| WO | WO 9522839 | 8/1995 |
| WO | WO 9639778 | 12/1996 |
| WO | WO 0106637 A1 | 1/2001 |
| WO | WO 0128310 | 4/2001 |

OTHER PUBLICATIONS

U.S. Appl. No. 11/700,515, filed Jan. 30, 2007, Utsunomiya.
U.S. Appl. No. 11/732,505, filed Apr. 2, 2007, Utsunomiya.
U.S. Appl. No. 11/700,511, filed Jan. 30, 2007, Utsunomiya.
U.S. Appl. No. 11/373,743, filed Mar. 10, 2006, Takatsugu.
U.S. Appl. No. 11/372,602, filed Mar. 10, 2006, Takatsugu.
International Search Report for related foreign application PCT/US02/33077, 2002.
Written Opinion of the International Searching Authority for Related Foreign Application PCT/US06/08633, Nov. 16, 2007.
International Search Report for Related Foreign Application PCT/US06/08633, Nov. 16, 2007.

* cited by examiner

MOSFET TEMPERATURE COMPENSATION CURRENT SOURCE

CROSS-REFERENCES TO RELATED APPLICATIONS

This application claims the benefit of U.S. Provisional Patent Application No. 60/660,728, filed Mar. 11, 2005, entitled "A MOSFET Temperature Compensation Current Source."

FIELD OF THE INVENTION

The present invention is directed towards the field of temperature compensation current sources.

BACKGROUND OF THE INVENTION

Figure 1:
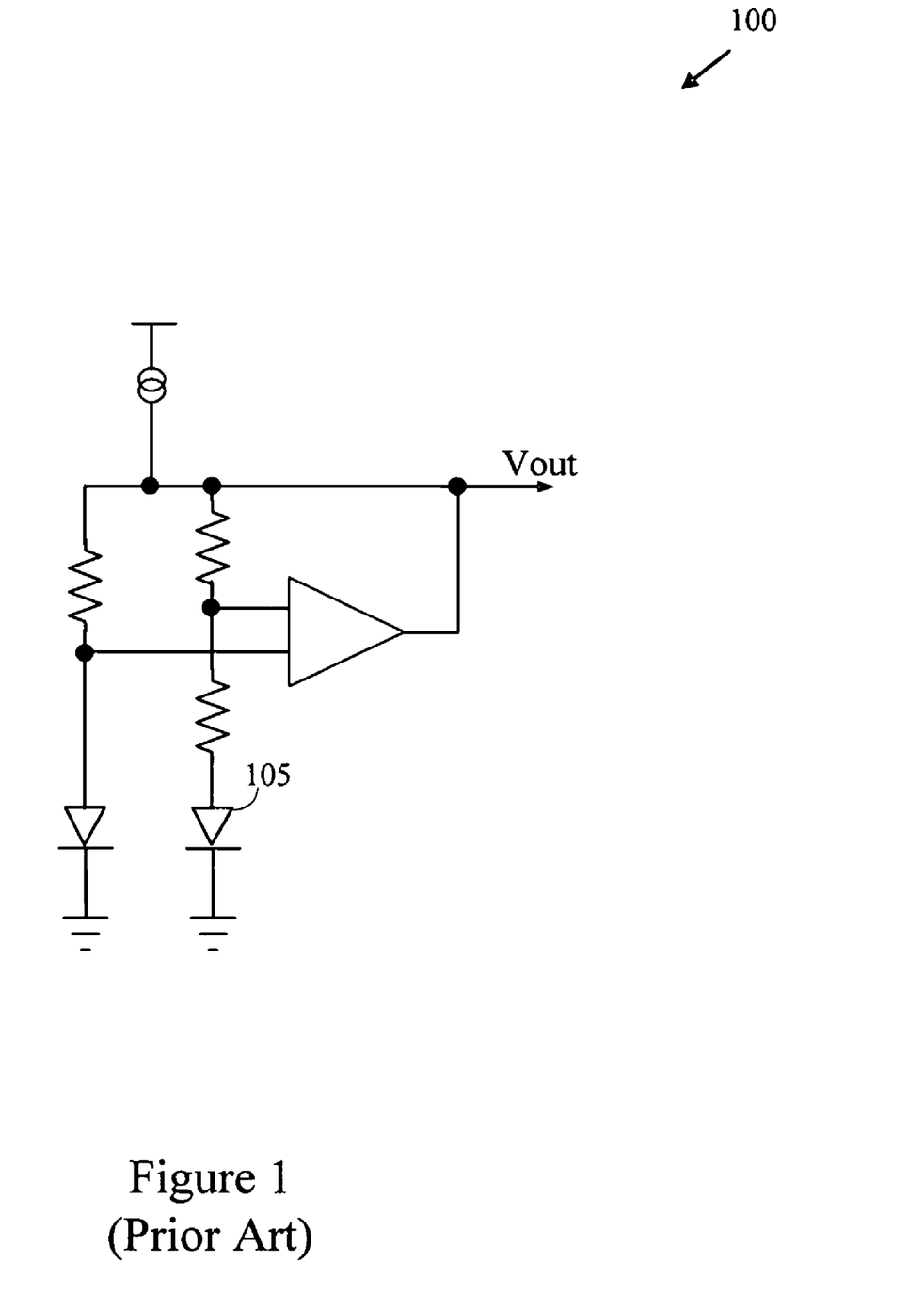
FIG. 1 shows a conventional current source implementing a junction diode.

Current sources are components commonly used in metal oxide semiconductor field effect transistors (MOSFETs). These current sources can be sensitive to temperature or process variations and produce an unstable and variable output current across a range of temperatures and process variations. Typically, current sources are designed to provide a constant current across temperature or process variations using junction diodes. FIG. 1 shows a conventional current source 100 implementing a junction diode 105 to achieve band gap voltage under full complementary metal oxide semiconductor (CMOS) processes. Under CMOS processes, however, junction diodes require large areas on a circuit.

Therefore, there is a need for a constant current source that does not vary significantly with temperature or process variations that requires less area on a circuit.

SUMMARY OF THE INVENTION

Some embodiments provide a current source that generates a constant current using metal oxide semiconductor (MOS) transistors. A biasing circuit generates a biasing current based on the transconductance of the MOS transistors. A load circuit generates a load current from the biasing current. In one embodiment, the load circuit comprises a resistor coupled in parallel with a MOS device (e.g., MOS transistor) having a resistance ($R_{MOS}$). The load current comprises the sum of a resistor current, which flows through the resistor, and a MOS current that flows through the MOS device.

The biasing current generated by the biasing circuit is constant except under temperature or process variations which may cause the biasing current to increase or decrease (due to the effect of temperature or process variations upon the transconductance of the MOS transistors). An increase or decrease in the biasing current (caused by temperature or process variations) produces an increase or decrease, respectively, in the resistor current that flows through the resistor of the load circuit. Temperature or process variations, however, also have an effect on the resistance value ($R_{MOS}$) of the MOS device of the load circuit and cause the resistance value $R_{MOS}$ to increase or decrease. The changes in the resistance value $R_{MOS}$ also causes a change in the MOS current that flows through the MOS device, whereby the change in MOS current offsets the change in the resistor current to produce a relatively constant load current.

For example, if temperature or process variations cause the biasing current to increase, the resistor current through the resistor of the load circuit increases. These temperature or process variations, however, also cause the resistance $R_{MOS}$ of the MOS device of the load circuit to increase, thereby causing the MOS current through the MOS device to decrease. Therefore, the decrease in the MOS current approximately offsets the increase in the resistor current to produce a relatively constant load current of the load circuit. Likewise, if temperature or process variations cause the biasing current to decrease, the resistor current through the resistor of the load circuit decreases. These temperature or process variations, however, also cause the resistance $R_{MOS}$ of the MOS device of the load circuit to decrease, thereby causing the MOS current through the MOS device to increase. Therefore, the increase in the MOS current approximately offsets the decrease in the resistor current to produce a relatively constant load current of the load circuit. As such, the changes in the biasing current due to temperature or process variations is, in effect, approximately offset by a change in the MOS current (of the MOS device of the load circuit) due to the same temperature or process variations.

Thus, the load current is relatively constant because variations of the biasing current and the resistor current are offset by variations of the MOS current across temperature or process variations. An output current of the current source is also equal to a sum of the resistor current and the MOS current. In one embodiment, the output current is output from a current mirror circuit that mirrors the load current as the output current. In some embodiments, the current source produces a stable output current ($I_{out}$) that does not vary significantly across temperatures and process variations, the current source being implemented without use of a junction diode.

In one embodiment, the biasing circuit comprises first and second transistor pairs. The first transistor pair generates a first transconductance between a reference voltage and the load circuit, and the second transistor pair generates a second transconductance between the reference voltage and ground. For this embodiment, the first transistor pair comprises a size greater than the second transistor pair (e.g., four times the size)

DETAILED DESCRIPTION

The disclosure of U.S. Provisional Patent Application No. 60/660,728, filed Mar. 11, 2005, entitled "A MOSFET Temperature Compensation Current Source," is hereby expressly incorporated herein by reference.

Although the present invention is described below in terms of specific exemplary embodiments, one skilled in the art will realize that various modifications and alterations may be made to the below embodiments without departing from the spirit and scope of the invention.

In the discussion below, Section I describes a constant current source and a method for generating a constant current. Section II describes characteristics of a non-constant current source and a constant current source. And Section III discusses output currents of current sources as a function of the transconductance parameter.

I. Constant Current Source

Figure 2:
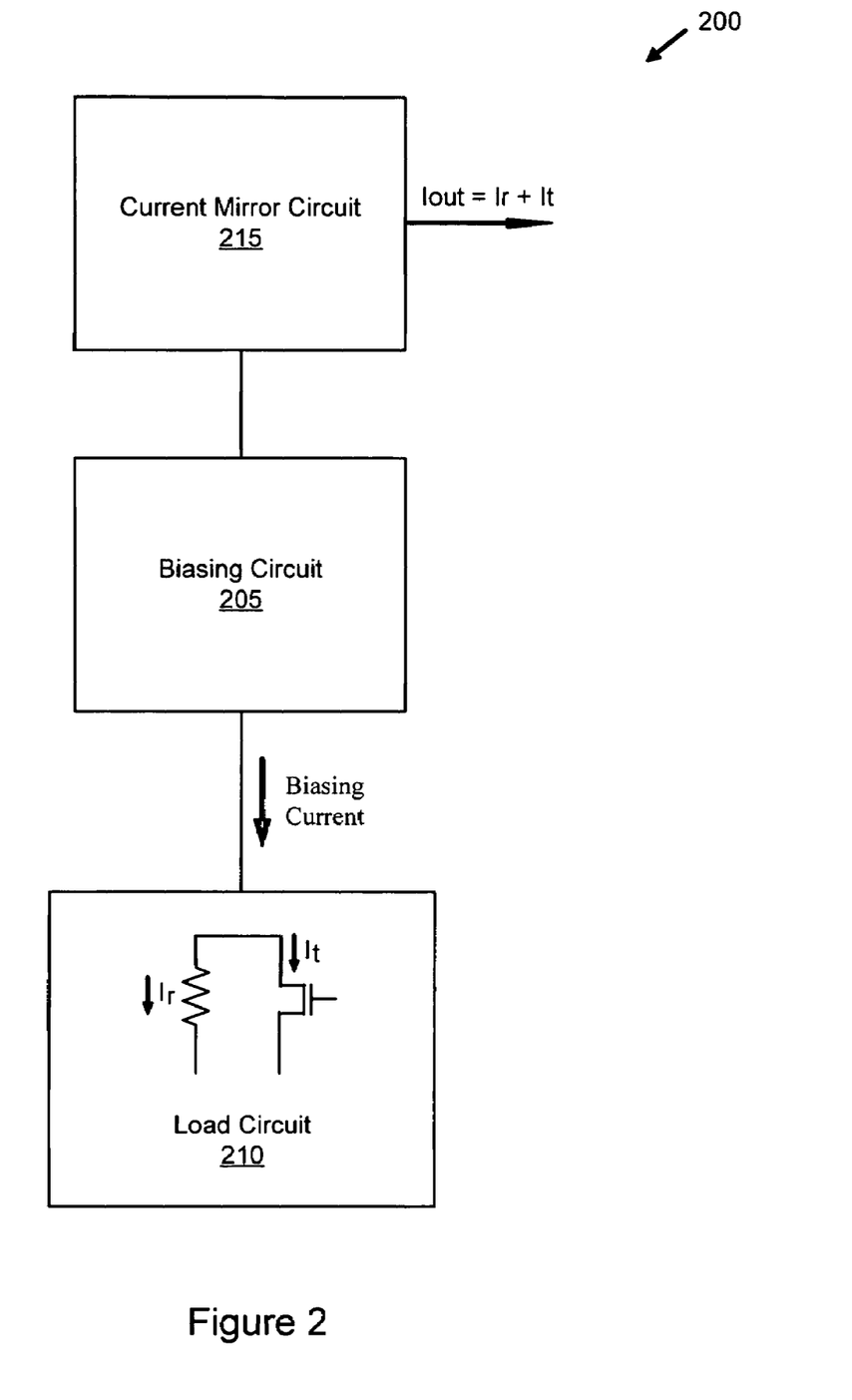
FIG. 2 is a block diagram illustrating a constant current source of some embodiments.

FIG. 2 is a block diagram illustrating a constant current source 200 of some embodiments. The constant current source 200 comprises a biasing circuit 205, a load circuit 210, and a current mirror circuit 215. The biasing circuit 205 comprises a plurality of metal oxide semiconductor (MOS) transistors for generating a biasing current based on transconductance of the MOS transistors.

The load circuit 210 is coupled to the biasing circuit 205 and comprises at least one resistor and at least one MOS device coupled in parallel with the at least one resistor. As described below, the MOS device of the load circuit 210 is a MOS transistor. In other embodiments, however, the MOS device is any other type of metal oxide semiconductor device. The load circuit 210 receives the biasing current from the biasing circuit 205 and generates a constant load current from the biasing current. In particular, the load circuit 210 generates a resistor current ($I_r$) that flows through the resistor and a MOS current ($I_t$) that flows through the MOS transistor, the load current being the sum of a resistor current and the MOS current. The load current is relatively constant because variations of the resistor current are offset by variations of the MOS current across temperature or process variations (i.e., the resistor and MOS currents balance each other to produce a constant load current).

The current mirror circuit 215 is coupled to the biasing circuit 205 and generates an output current ($I_{out}$) equal to a sum of the resistor current ($I_r$) and the MOS current ($I_t$). The current mirror circuit 215 mirrors the load current of the load circuit 210 as the output current ($I_{out}$). In some embodiments, the current source 200 produces a stable output current ($I_{out}$) that does not vary significantly across temperatures and process variations, the current source being implemented without use of a junction diode.

If the current source 200 is to produce a constant output current of value A, the first current has a value of B, and the second current has a value of C, then A=B+C. If the first current changes in value, the second current balances the first current so that the output current is still approximately equal to A. For example, if temperature or processing variations cause the first current to increase in value to equal (B+delta), the value of the second current would thereby decrease in value to approximately equal (C−delta) so that the sum of the first and second currents is still approximately equal to A. Conversely, if temperature or processing variations cause the first current to decrease in value to equal (B−delta), the value of the second current would thereby increase in value to approximately equal (C+delta) so that the sum of the first and second currents is still approximately equal to A.

Figure 3:
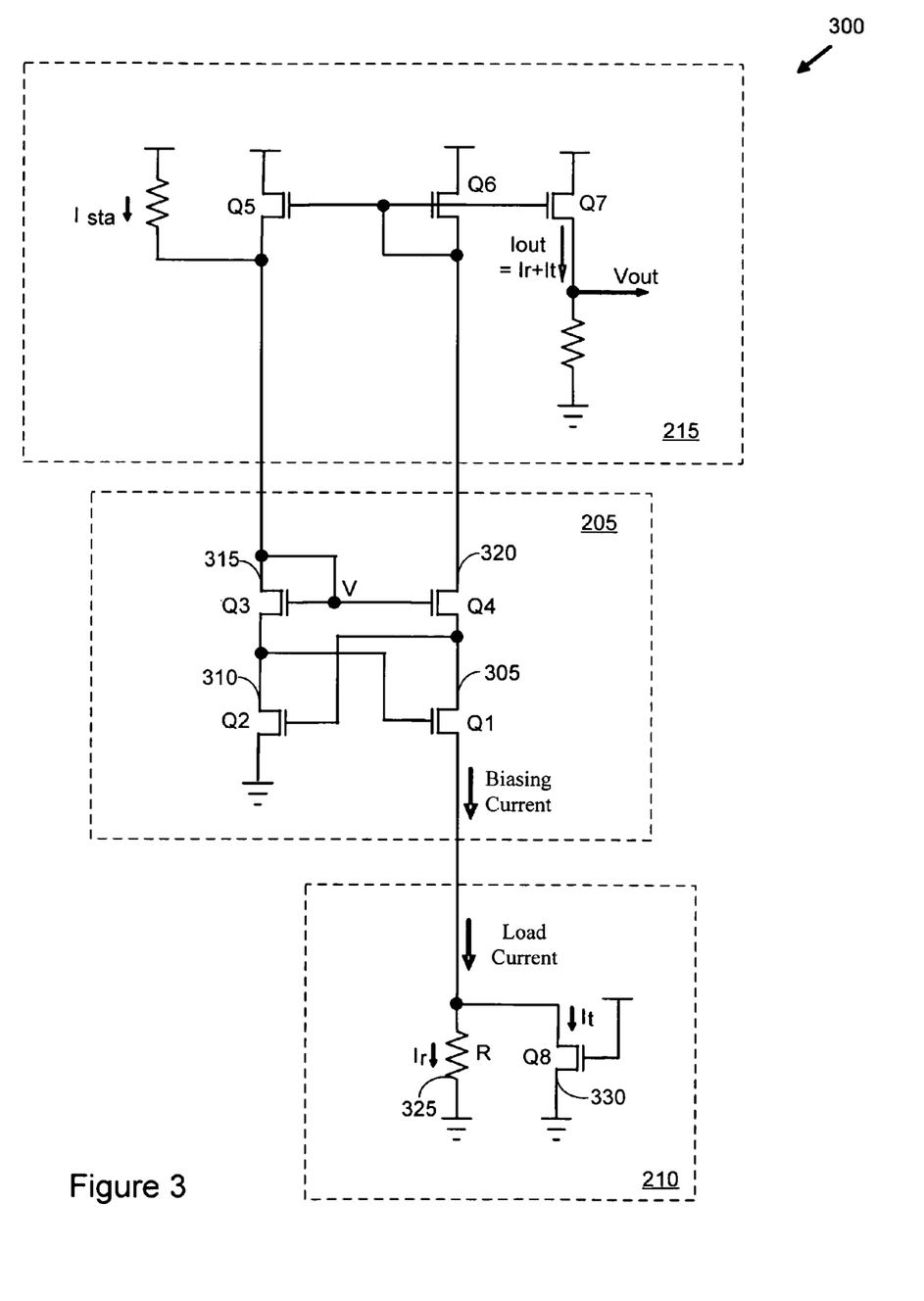
FIG. 3 is a block diagram illustrating detail of a constant current source of some embodiments.

FIG. 3 is a block diagram illustrating detail of a constant current source 300 of some embodiments. The constant current source 200 comprises a biasing circuit 205, a load circuit 210, and a current mirror circuit 215.

The biasing circuit 205 comprises a plurality of metal oxide semiconductor (MOS) transistors Q1 (305), Q2 (310), Q3 (315), and Q4 (320). As shown in FIG. 3, a gate of the transistor Q3 is coupled to a drain of transistor Q3, a source of transistor Q3 is coupled to a gate of transistor Q1, and a source of transistor Q1 is coupled to the load circuit, a drain of transistor Q2 is coupled to the source of transistor Q3, a source of transistor Q2 is coupled to ground, a gate of the transistor Q2 is coupled to a source of transistor Q4 and to the drain of transistor Q1, and the gate of the transistor Q3 is coupled to the gate of transistor Q4.

The biasing circuit 205 receives a starting current ($I_{sta}$) and generates a regulated biasing current based on transconductance of the MOS transistors Q1 (305), Q2 (310), Q3 (315), and Q4 (320). In particular, the biasing circuit 205 comprises a first transistor pair Q1 (305) and Q3 (315) and a second transistor pair Q2 (310) and Q4 (320). The first transistor pair Q1 (305) and Q3 (315) generates a first transconductance between a reference voltage and the load circuit 210. The second transistor pair Q2 (310) and Q4 (320) generates a second transconductance between the reference voltage and ground.

The load circuit 210 is coupled to the biasing circuit 205 and comprises a resistor 325 coupled in parallel with a MOS transistor Q8 (330). The load circuit 210 receives the biasing current from the biasing circuit 205 and generates a constant load current from the biasing current. The load circuit 210 generates a resistor current ($I_r$) through the resistor 325 and a MOS current ($I_t$) through the MOS transistor 330, whereby load current equals resistor current ($I_r$)+MOS current ($I_t$).

The biasing current generated by the biasing circuit 205 is constant except under temperature or process variations which may cause the biasing current to increase or decrease (due to the effect of temperature or process variations upon the transconductance of the MOS transistors Q1 to Q4 of the biasing circuit 205). An increase or decrease in the biasing current (caused by temperature or process variations) produces an increase or decrease, respectively, in the resistor current ($I_r$) through the resistor 325 of the load circuit 210. Temperature or process variations, however, also have an effect on the resistance value ($R_{MOS}$) of the MOS device 330 of the load circuit 210 and cause the resistance value $R_{MOS}$ to increase or decrease. The changes in the resistance value $R_{MOS}$ also causes a change in the MOS current ($I_t$) that flows through the MOS device 330, whereby the change in MOS current ($I_t$) offsets the change in the resistor current ($I_r$) to produce a relatively constant load current.

For example, if temperature or process variations cause the biasing current to increase, the resistor current ($I_r$) through the resistor 325 of the load circuit 210 increases. These temperature or process variations, however, also cause the resistance $R_{MOS}$ of the MOS device 330 of the load circuit 210 to increase, thereby causing the MOS current ($I_t$) through the MOS device 330 to decrease. Therefore, the decrease in the MOS current ($I_t$) offsets the increase in the resistor current ($I_r$) to produce a relatively constant load current of the load circuit 210. Likewise, if temperature or process variations cause the biasing current to decrease, the resistor current ($I_r$) through the resistor 325 of the load circuit decreases. These temperature or process variations, however, also cause the resistance $R_{MOS}$ of the MOS device 330 of the load circuit to decrease, thereby causing the MOS current ($I_t$) through the MOS device to increase. Therefore, the increase in the MOS current ($I_t$) offsets the decrease in the resistor current ($I_r$) to produce a relatively constant load current of the load circuit. As such, the changes in the biasing current due to temperature or process variations is, in effect, approximately offset by a change in the MOS current (of the MOS device of the load circuit) due to the same temperature or process variations. Thus, the load current is relatively constant because variations of the biasing current and resistor current ($I_r$) are offset by variations of the MOS current ($I_t$) across temperature or process variations.

As shown in FIG. 3, the voltage drop through transistors Q1 and Q3 and the resistor 325 is equal to the voltage drop through transistors Q2 and Q4. This can be shown by the following observations:

the voltage at the gate of transistor Q3 is equal to the voltage at the gate of transistor Q4 (indicated by point V in FIG. 3);

the gate to source voltage of Q3 ($V_{GS3}$) plus the gate to source voltage of Q1 ($V_{GS1}$) plus the voltage across the resistor 325 ($I_r*R$) is equal to the gate to source voltage of Q4 ($V_{GS4}$) plus the gate to source voltage of Q2 ($V_{GS2}$) so that:

$$V = V_{GS3} + V_{GS1} + I_r*R = V_{GS4} + V_{GS2}$$

the drain to source voltage of Q8 ($V_{DS8}$) is equal to the voltage across the resistor 325 ($I_r*R$) so that:

$$V_{DS8} = I_r*R$$

As such, in some embodiments, the first transistor pair Q1 (305) and Q3 (315) comprises transistors that are larger in size than the transistors of the second transistor pair Q2 (310) and Q4 (320) to accommodate the additional voltage drop ($I_r*R$) across the resistor 325 (which lies in the voltage drop path of transistors Q1 and Q3). In one embodiment, the size of transistors Q1 and Q3 are four times the size of transistors Q2 and Q4.

The current mirror circuit 215 is coupled to the biasing circuit 205 and comprises a plurality of MOS transistors Q5 (335), Q6 (340), and Q7 (345). As shown in FIG. 3, transistor Q5 is coupled to transistor Q3 and mirrors current flowing through transistors Q3 and Q2; transistor Q6 is coupled to transistors Q5 and Q4 and mirrors current flowing through transistors Q4 and Q1; and transistor Q7 is coupled to transistor Q6 and mirrors current flowing through transistor Q6 and sources the output current. The current mirror circuit 215 further comprises a resistor that couples the source of transistor Q7 to ground. The current mirror circuit 215 mirrors the load current of the load circuit 210 to generate an output current ($I_{out}$). The generated output current ($I_{out}$) is equal to a sum of the resistor current ($I_r$) across the resistor 325 and the MOS current ($I_t$) across transistor Q8 (330) of the load circuit 210 so that:

$$I_{out} = I_r + I_t$$

Figure 4:
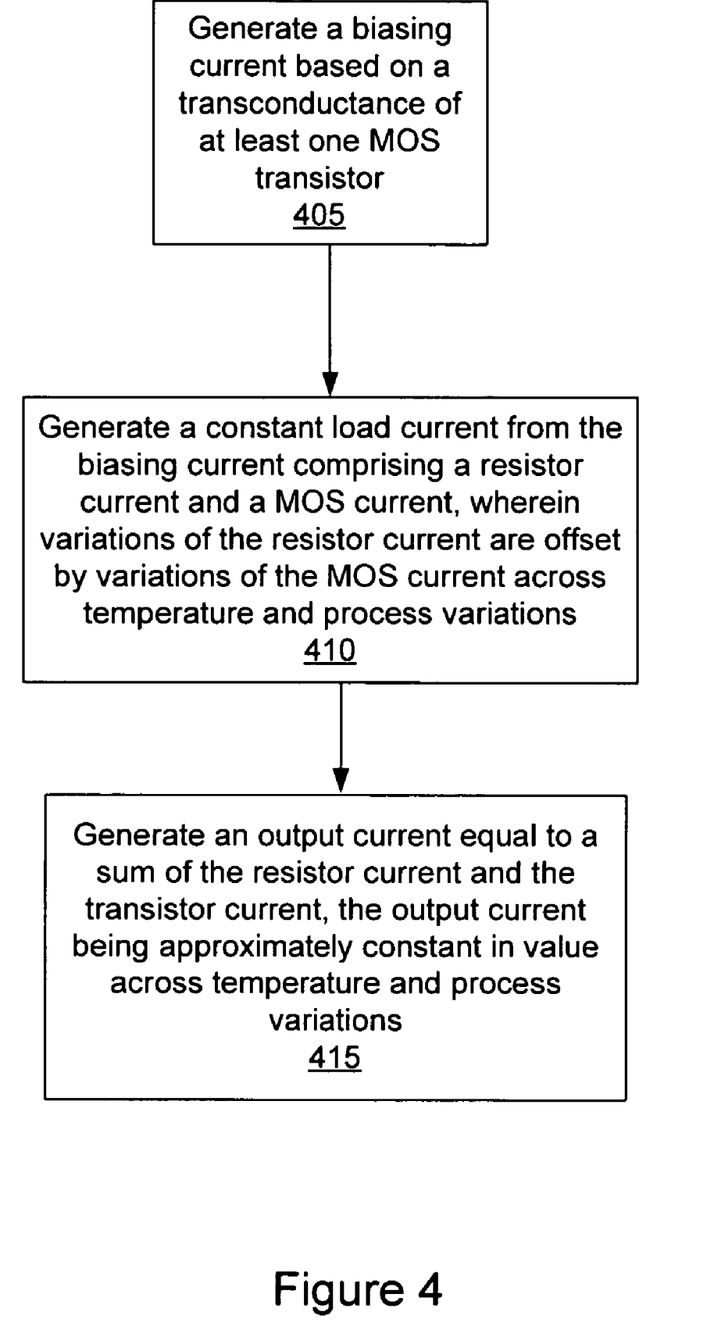
FIG. 4 is a flowchart showing a method for generating a constant current using metal oxide semiconductor (MOS) transistors.

FIG. 4 is a flowchart showing a method 400 for generating a constant current using metal oxide semiconductor (MOS) transistors. The method 400 begins by generating (at 405) a biasing current (e.g., using a biasing circuit comprising a plurality of MOS transistors), the biasing current being generated based on a transconductance of at least one MOS transistor. For example, the method may generate the biasing current by generating a first transconductance between a reference voltage and a load circuit and generating a second transconductance between the reference voltage and ground.

The method then generates (at 410) a constant load current from the biasing current (e.g., using a load circuit comprising a resistor and a MOS transistor in parallel), the load current comprising a resistor current and a MOS current, wherein variations of the resistor current are offset by variations of the MOS current across temperature or process variations. The method then generates (at 415) an output current equal to a sum of the resistor current and the MOS current, the output current being approximately constant in value across temperature or process variations.

II. Current Source Characteristics

Characteristics of the constant current source can be better understood by first examining the characteristics of a non-constant current source that produces an output current that varies significantly across temperature or processing variations. As known in the art, a transconductance parameter (KP) of a current source has a high correlation to temperature or processing variations and varies significantly along with temperature or processing variations. As such, the transconductance parameter of a current source is typically used to correlate variations in the output current of the current source to variations in temperature or processing. Thus, a current source that produces significant variations in its output current as the transconductance parameter of the current source varies is also considered to produce significant variations in its output current with temperature or processing variations (as discussed further below in relation to FIG. 7). Such a current source is sometimes referred to as a KP dependent current source.

Figure 5:
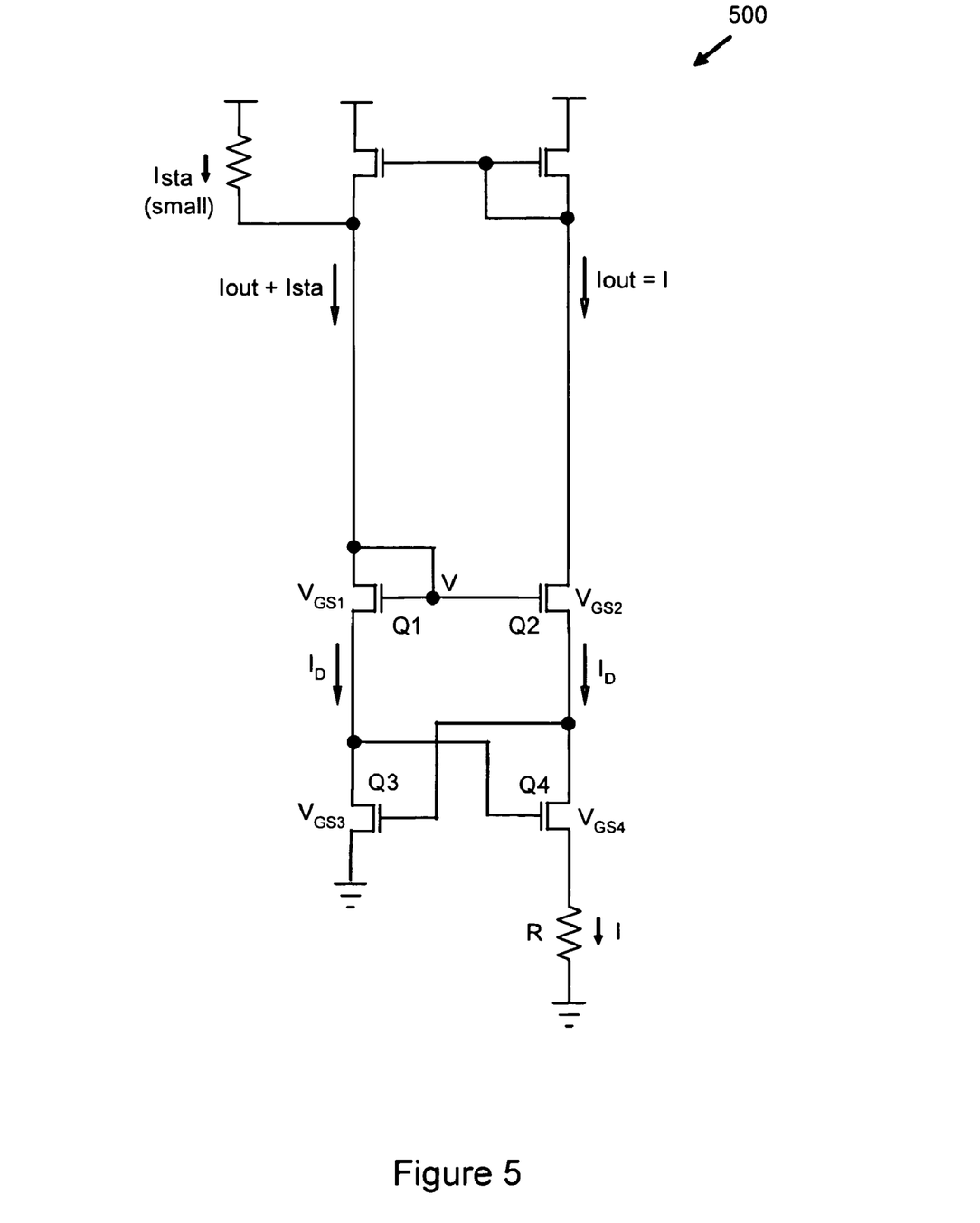
FIG. 5 is a circuit analysis diagram of a non-constant current source.

FIG. 5 is a circuit analysis diagram of a KP dependent current source 500 that does not produce a constant current across temperature or processing variations. Note that in comparison with the constant current source 300 of FIG. 3, the KP dependent current source 500 does not have a MOS device connected in parallel with resistor R so that there is no offsetting MOS current. Thus the output current ($I_{out}$) of the KP dependent current source 500 is equal to the current (I) across the resistor R. As discussed below in relation to FIG. 7, the current (I) across the resistor R varies significantly across temperature or processing variations.

To determine temperature compensation (TC) as a function of output current ($I_D$) for the KP dependent current source 500 of FIG. 5:

Given:
k = gain of current source circuit;
W = width of gate channel;
L = length of gate channel;
N = transistor size multiplication factor between Q1 and Q2 and between Q4 and Q3 (e.g., if Q1 and Q4 are four times larger than Q2 and Q3, N=4);
KP = transconductance parameter (A/V$^2$);
$I_D$ = drain current;
$V_{TH}$ = threshold voltage;
$V_{GS}$ = gate-source voltage;
$V_{DS}$ = drain-source voltage; and
T = temperature, then:

$$V_{GS1} + V_{GS4} + RI = V_{GS3} + V_{GS2}$$

$$RI = (V_{GS3} - V_{GS1}) + (V_{GS2} - V_{GS4})$$

$$RI = 2\Delta V_{GS}$$

(if $I_{STA} \ll I_{OUT}$, $I_{OUT} = I_D$)

$$I_D = I = I_{OUT} = \frac{2\Delta V_{GS}}{R}$$

$$\Delta V_{GS} = k * \sqrt{\frac{I_D}{KP}}$$

-continued $$k = \sqrt{\frac{2}{\left(\frac{W}{L}\right)}} * \left(1 - \frac{1}{\sqrt{N}}\right)$$

$$I_D = I = 2 * \frac{1}{R} k * \sqrt{\frac{I_D}{KP}} = \frac{2k}{R} * \sqrt{\frac{I_D}{KP}}$$

$$\frac{R}{2k} I_D = \sqrt{\frac{I_D}{KP}} \Rightarrow \left(\frac{R}{2k}\right)^2 * I_D^2 = \frac{I_D}{KP}$$

$$\therefore I_D = \left(\frac{2k}{R}\right)^2 * \frac{1}{KP} = I_{OUT}$$

As such, temperature compensation (TC) as a function of output current ($I_D$) can be represented by the equation:

$$TC(I_D) = -TC(KP) - 2TC(R) = -\left(\frac{-1.5}{T}\right) - 2a = \left(\frac{1.5}{T}\right) - 2a$$

where:

$a$ = the temperature compensation value at resistor $R$.

To determine the value of the output current ($I_D$):

where:

$$I_D = \left(\frac{2k}{R}\right)^2 * \frac{1}{KP}$$

$$k = \sqrt{\frac{2}{\left(\frac{W}{L}\right)}} * \left(1 - \frac{1}{\sqrt{N}}\right)$$

then:

$$I_D = 4k^2 * \frac{1}{R^2 * KP}$$

$$I_D = 4 * \frac{2}{\frac{W}{L}} \left(1 - \frac{1}{\sqrt{N}}\right)^2 \frac{1}{R^2} * \frac{1}{KP}$$

$$V_{ON} = \sqrt{\frac{2I_D}{KP\left(\frac{W}{L}\right)}}$$

$$V_{ON}^2 = \frac{2I_D}{KP\left(\frac{W}{L}\right)}$$

$$\frac{V_{ON}^2}{2I_D} = \frac{1}{KP\left(\frac{W}{L}\right)}$$

$$I_D = \frac{V_{ON}^2}{2I_D} * 8\left(1 - \frac{1}{\sqrt{N}}\right)^2 \frac{1}{R^2}$$

$$I_D^2 = V_{ON}^2 * 4\left(1 - \frac{1}{\sqrt{N}}\right)^2 \frac{1}{R^2}$$

$$I_D = 2V_{ON} * \left(1 - \frac{1}{\sqrt{N}}\right) \frac{1}{R}$$

For example:

$$N = 4$$

$$\left(1 - \frac{1}{\sqrt{N}}\right) = 0.5$$

$$I_D = V_{ON} * \frac{1}{R}$$

$$V_{ON} = 0.5V$$

$$I_D = 100mA \Rightarrow R = \frac{V_{ON}}{I_D} = \frac{0.5}{100m} = 5kOhm$$

Other characteristics of the MOSFET KP dependent current source 500 of FIG. 5 are shown by the following equations:

$$g_m(V_{GS} - V_{TH}) = 2I_D$$

$$V_{GS} = V_{TH} + \frac{2I_D}{g_m}$$

$$g_m = \sqrt{2 * I_D * KP * \left(\frac{W}{L}\right)}$$

$$V_{GS} = V_{TH} + \frac{2I_D}{\sqrt{2 * I_D * KP * \left(\frac{W}{L}\right)}} = V_{GS1}$$

$$V_{GS2} = V_{TH} + \sqrt{\frac{2I_D}{KP * \left(\frac{W}{L}\right) * N}} = V_{GS2}$$

$$V_{GS1} \Rightarrow \frac{W}{L}$$

$$V_{GS2} \Rightarrow n * \frac{W}{L}$$

(if both $I_D$ are same)

$$V_{GS} = |V_{GS1} - V_{GS2}|$$

$$V_{GS} = V_{TH} + \sqrt{\frac{2I_D}{KP * \left(\frac{W}{L}\right)}} - V_{TH} - \sqrt{\frac{2I_D}{KP * \left(\frac{W}{L}\right)}} * \frac{1}{\sqrt{N}}$$

$$V_{GS} = \sqrt{\frac{2I_D}{KP * \left(\frac{W}{L}\right)}} * \left(1 - \frac{1}{\sqrt{N}}\right) = k * \sqrt{\frac{I_D}{KP}}$$

$$I_D = \frac{\Delta V_{GS}}{R} = k * \frac{1}{R} * \sqrt{\frac{I_D}{KP}}$$

$$k = \sqrt{\frac{2}{\left(\frac{W}{L}\right)}} * \left(1 - \frac{1}{\sqrt{N}}\right)$$

$$\frac{R * I_D}{k} = \sqrt{\frac{I_D}{KP}}$$

$$\frac{R^2 * I_D^2}{k^2} = \frac{I_D}{KP}$$

thus:

$$I_D = \frac{k^2}{R^2} = \frac{1}{KP}.$$

Figure 6:
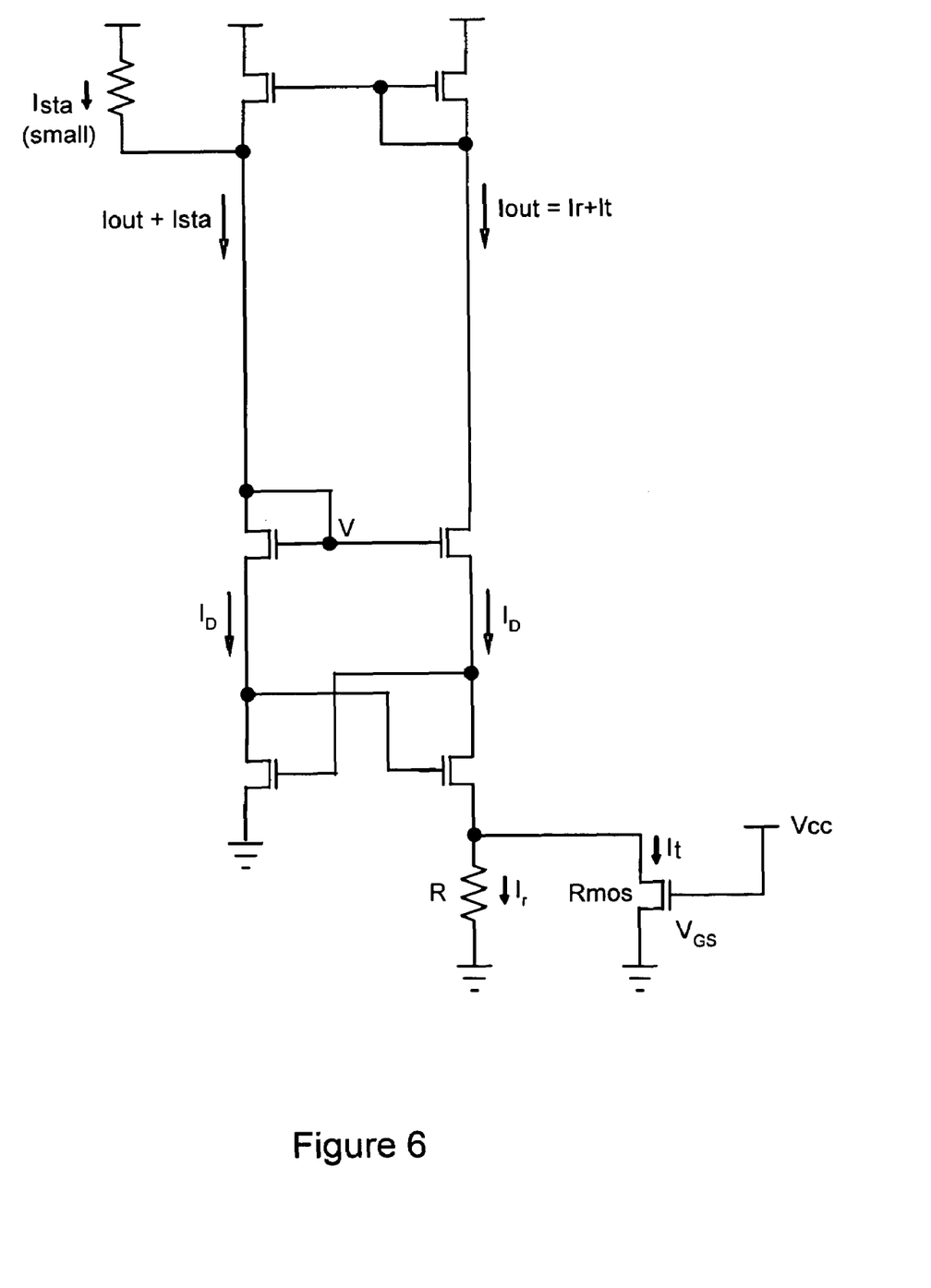
FIG. 6 is a circuit analysis diagram of the constant current source of FIG. 3.

FIG. 6 is a circuit analysis diagram of the constant current source 300 of FIG. 3. Characteristics of the constant current source 300 are shown by the following equations:

Given:

$$I_t = \left(\frac{2k}{R}\right)^2 * \frac{1}{KP}$$

$$k = \sqrt{\frac{2}{\left(\frac{W}{L}\right)}} * \left(1 - \frac{1}{\sqrt{N}}\right)$$

$$R_{MOS} = \left(\frac{1}{\frac{W}{L} * KP * (V_{GS} - V_{TH})}\right)$$

$$V_{ON} = \sqrt{\frac{2I_D}{KP\left(\frac{W}{L}\right)}}$$

$$V_{ON} \propto (KP)^{-0.5}$$

then:

$$I_t = \left[2k * \left(\frac{W}{L}\right) * KP * (V_{GS} - V_{TH})\right]^2 * \left(\frac{1}{KP}\right)$$

$$I_t = \left[2k * \left(\frac{W}{L}\right) * (V_{GS} - V_{TH})\right]^2 * KP$$

$$I_r \propto \frac{1}{KP} * \frac{1}{R}$$

$$I_t \propto (V_{GS} - V_{TH})^2 * KP^2$$

when $(I_r = I_t)$:

$$\left(\frac{2k}{R}\right)^2 = \left[2k * \left(\frac{W}{L}\right) * (V_{GS} - V_{TH})\right]^2$$

$$\frac{1}{R} = \left(\frac{W}{L}\right) * (V_{GS} - V_{TH})$$

$$V_{GS} = N * (V_{ON} + V_{TH})$$

$$N * (V_{ON} + V_{TH}) - V_{TH} = (N * V_{ON}) + ((N - 1) * V_{TH})$$

III. Output Current as a Function of the Transconductance Parameter KP

As discussed above, the transconductance parameter KP of a current source varies significantly with temperature or processing variations and can be used to correlate the output current of the current source to variations in temperature or processing. A current source that produces significant variations in its output current as the transconductance parameter KP of the current source varies is also considered to produce significant variations in its output current with temperature or processing variations.

Figure 7:
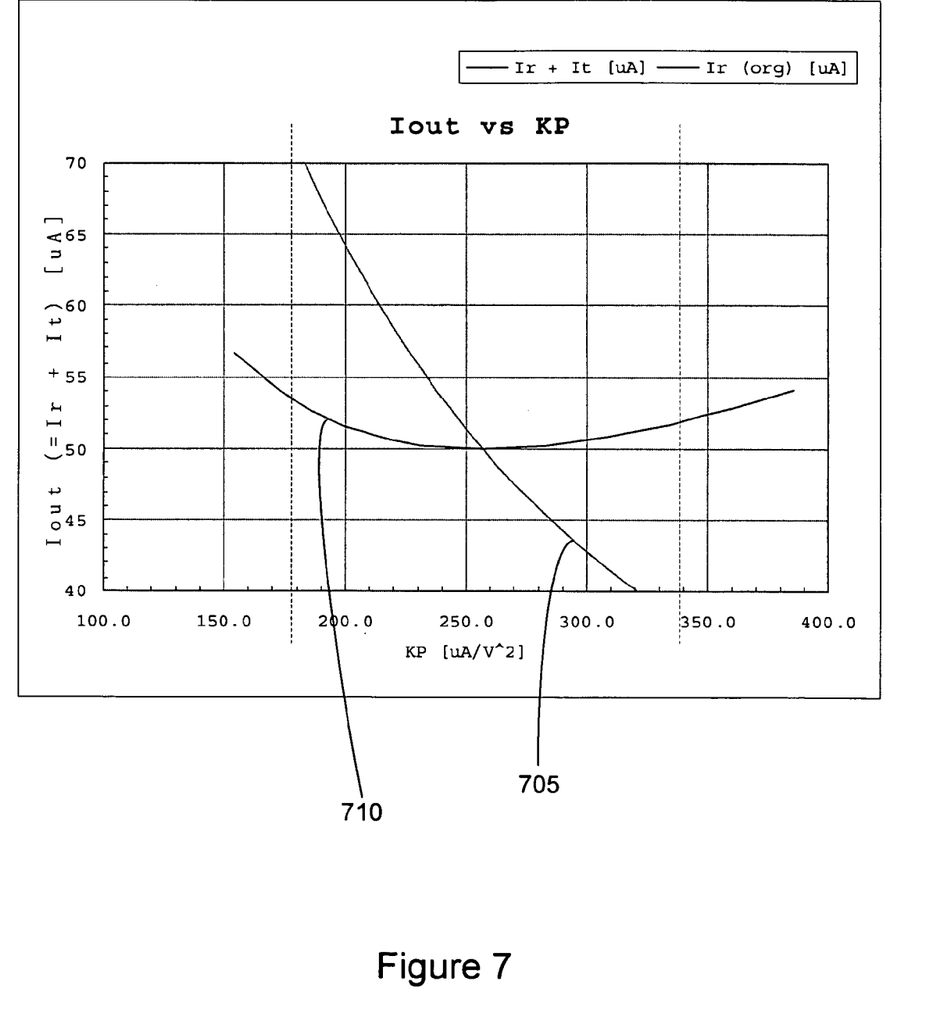
FIG. 7 is a graph that shows the output currents of a constant current source and a non-constant current source as a function of the transconductance parameter KP.

FIG. 7 is a graph that shows the output currents of a constant current source and a non-constant current source as a function of the transconductance parameter KP of the current sources across a range of KP values from a lower boundary to an upper boundary (assuming that temperature or process variations of KP are +30%). A first graph line 705 shows the output current of a non-constant current source as a function of the transconductance parameter KP of the current source. In particular, the first graph line 705 shows the output current of the KP dependent current source 500 of FIG. 5 where the output current is equal to the current ($I_r$) across the resistor R. As shown in FIG. 7, the output current of the KP dependent current source 500 varies significantly across the various values of KP. This indicates that the output current of the KP dependent current source 500 would also vary significantly across temperature or process variations.

A second graph line 710 shows the output current of the constant current source 300 of FIG. 3 as a function of the transconductance parameter KP of the current source, whereby the output current is equal to a resistor current ($I_r$) across a resistor R and a MOS current ($I_t$) across a transistor. As shown in FIG. 7, the output current of the constant current source 300 is relatively constant within various values of KP that reflect typical operating conditions (indicated by the dashed lines). This indicates that the output current of the constant current source 300 would also be relatively constant across temperature or process variations. This is due to the fact that as the value of the resistor current ($I_r$) varies over various values of KP, the values of the MOS current ($I_t$) varies to offset the variations of the resistor current ($I_r$) to maintain a relatively constant output current ($I_{out}$).

One of ordinary skill will recognize that the invention can be embodied in other specific forms without departing from the spirit of the invention, even though the invention has been described with reference to numerous specific details. In view of the foregoing, one of ordinary skill in the art would understand that the invention is not to be limited by the foregoing illustrative details, but rather is to be defined by the appended claims.

What is claimed is:

1. A current source circuit comprising:
   biasing circuit comprising a plurality of metal oxide semiconductor (MOS) transistors for generating a biasing current;
   load circuit comprising:
      at least one MOS device for receiving the biasing current and generating a MOS current through the MOS device; and
      resistor the load circuit receiving the biasing current and generating a resistor current through the resistor; and
   current mirror circuit, coupled to the biasing circuit, for generating an output current equal to the sum of the resistor current and the MOS current,
   wherein a change in the biasing current due to temperature or process variations is approximately offset by a change in MOS current due to the temperature or process variations, and a change in the resistor current due to the temperature or process variations is approximately offset by a change in the MOS current due to the temperature or process variations to produce the output current that is approximately constant across temperature and process variations.

2. The current source circuit of claim 1, wherein:
   temperature or process variations cause an increase in the biasing current and an increase in the resistance of the MOS device, whereby the increase in the resistance of the MOS device causes a decrease in the MOS current which approximately offset the increase in the biasing current.

3. The current source circuit of claim 1, wherein:
   temperature or process variations cause decrease in the biasing current and a decrease in the resistance of the MOS device, whereby the decrease in the resistance of the MOS device causes an increase in the MOS current which approximately offsets the decrease in the biasing current.

4. The current source circuit claim 1, wherein the biasing circuit generates the biasing current based on transconductance of the MOS transistors of the biasing circuit.

5. The current source circuit of claim 4, wherein the biasing circuit comprises:
first transistor pair for generating a first transconductance between a reference voltage and the load circuit; and
second transistor pair for generating a second transconductance between the reference voltage and ground.

6. The current source circuit of claim 5, wherein the first transistor pair comprises a size four times as large as the second transistor pair.

7. The current source circuit of claim 1, wherein the biasing circuit comprises:
first and third transistors, wherein a gate of the third transistor is coupled to a drain of the third transistor, a source of the third transistor is coupled to a gate of the first transistor, and a source of the first transistor is coupled to the load circuit; and
second and fourth transistors, wherein a drain of the second transistor is coupled to the source of the third transistor, a source of the second transistor is coupled to ground, a gate the second transistor is coupled to a source of the fourth transistor and to the drain of the first transistor, and the gate of the third transistor is coupled to the gate of the fourth transistor
wherein the gate to source voltage of the third transistor ($V_{GS3}$) plus the gate to source voltage of the first transistor ($V_{GS1}$) plus the voltage across the resistor ($I_f * R$) of the load circuit is equal to the gate to source voltage of the fourth transistor ($V_{GS4}$) plus the gate to source voltage of the second transistor ($V_{GS2}$), as represented by the equation:

$$V_{GS3} + V_{GS1} + I_f R = V_{GS4} + V_{GS2}.$$

8. A current source circuit comprising:
means for generating a biasing current;
means for receiving the biasing current and generating a current through a metal oxide semiconductor (MOS) device (MOS current), the means for receiving the biasing current further comprising means generating a resistor current through a resistor; and
means for generating an output current equal to the sum of the resistor current and the MOS current,
wherein a change in the biasing current due to temperature or process variations is approximately offset by a change in the MOS current due to the temperature or process variations, and a change in the resistor current due to the temperature or process variations is approximately offset by a change in the MOS current due to the temperature process variations to produce the output current that is approximately constant across temperature and process variations.

9. The current source circuit of claim 8, wherein:
temperature or process variations cause an increase in the biasing current and an increase in the resistance of the device, whereby the increase in the resistance of the MOS device causes a decrease in the MOS current which approximately offsets the increase in the biasing current.

10. The current source circuit of claim 8, wherein:
temperature or process variations cause a decrease the biasing current and a decrease in the resistance in the MOS device, whereby the decrease in the resistance of the MOS device causes an increase in the MOS current which approximately offset the decrease in the biasing current.

11. The current source circuit of claim 8, wherein the means for generating the biasing current comprises a means for generating the biasing current based on transconductance of one or more MOS transistors.

12. A method for generating current, the method comprising:
generating a biasing current;
receiving the biasing current and generating a current through a metal oxide semiconductor (MOS) device (MOS current);
generating a resistor current through a resistor; and
generating an output equal to the sum of the resistor current and the MOS current,
wherein a change in the biasing current due to temperature or process variations is approximately offset by a change in the MOS current due to the temperature or process variations, and a change in the resistor current due to the temperature or process variations is approximately offset by a change in the MOS current due to the temperature or process variations to produce the output current that is approximately constant across temperature and process variations.

13. The method of claim 12, wherein:
temperature or process variations cause an increase to the biasing current and an increase in the resistance of the MOS device, whereby the increase in the resistance of the MOS device causes a decrease in the MOS current which approximately offsets the increase in the biasing current.

14. The method of claim 12, wherein:
temperature or process variations cause a decrease in the biasing current and a decrease or the resistance of MOS device, whereby the decrease in the resistance of the MOS device causes an increase in the MOS current which approximately offsets the decrease in the biasing current.

15. The method of claim 12, wherein generating the biasing current comprises generating the biasing current based on transconductance of one or more MOS transistors.

16. A current source circuit comprising:
biasing circuit comprising a plurality of metal oxide semiconductor (MOS) transistors for generating a biasing current based on transconductance of the MOS transistors of the biasing circuit,
wherein the biasing circuit comprises:
first transistor pair for generating a first transconductance between a reference voltage and a load circuit; and
second transistor pair for generating a second transconductance between the reference voltage and ground, wherein the first transistor pair comprises a size approximately four times as large as the second transistor pair; and
the load circuit comprising at least one MOS device for receiving the biasing current and generating a MOS current through the MOS device,
wherein a change in the biasing current due to temperature or process variations is approximately offset by a change in the MOS current due to the temperature or process variations.

17. A current source circuit comprising:
biasing circuit comprising a plurality of metal oxide semiconductor (MOS) transistors for generating a biasing current, wherein the biasing circuit comprises:
first and third transistors, wherein a gate of the third transistor is coupled to a drain of the third transistor, a source of the third transistor is coupled to a gate of the first transistor, and a source of the first transistor is coupled to a load circuit; and second and fourth transistors, wherein a drain of the second transistor is coupled to the source of the third transistor, a source of the second transistor is coupled to ground, a gate of the second transistor is coupled to a source of the fourth transistor and to the drain of the first transistor, and the gate of the third transistor is coupled to the gate of the fourth transistor, wherein the gate to source voltage of the third transistor ($V_{GS3}$) plus the gate to source voltage of the first transistor ($V_{GS1}$) plus the voltage across the resistor ($I_r$*R) of the load circuit is equal to the gate to source voltage of the fourth transistor ($V_{GS4}$) plus the gate to source voltage of the second transistor ($V_{GS2}$), as represented by the equation:

$$V_{GS3} + V_{GS1} + I_r*R = V_{GS4} + V_{GS2}; \text{ and}$$

the load circuit comprising at least one MOS device for receiving the biasing current and generating a MOS current through the MOS device, wherein a change in the biasing current due to temperature or process variations is approximately offset by a change in the MOS current due to the temperature or process variations.

* * * * *